United States Patent
Ikeno et al.

(10) Patent No.: US 8,294,782 B2
(45) Date of Patent: Oct. 23, 2012

(54) ELECTROMAGNETIC FIELD HIGH SPEED IMAGING APPARATUS

(75) Inventors: Ryohei Ikeno, Tokyo (JP); Masahiro Tsuchiya, Koganei (JP)

(73) Assignees: Stanley Electric Co., Ltd., Tokyo (JP); National Institute of Information and Communications Technology, Tokyo (JP)

( * ) Notice: Subject to any disclaimer, the term of this patent is extended or adjusted under 35 U.S.C. 154(b) by 259 days.

(21) Appl. No.: 12/855,841

(22) Filed: Aug. 13, 2010

(65) Prior Publication Data

US 2011/0043653 A1 Feb. 24, 2011

(30) Foreign Application Priority Data

Aug. 20, 2009 (JP) ................. 2009-190809

(51) Int. Cl.
*H04N 5/228* (2006.01)
*H04N 3/14* (2006.01)
*H04N 5/222* (2006.01)
*G02B 27/10* (2006.01)
*G01C 3/08* (2006.01)
*G02F 1/09* (2006.01)

(52) U.S. Cl. ............... 348/222.1; 348/370; 348/308; 348/343; 356/4.01; 359/280

(58) Field of Classification Search ............... 348/222.1, 348/370, 371, 335, 343, 126; 359/280, 281; 356/4.01, 5.09; 250/208.1
See application file for complete search history.

(56) References Cited

U.S. PATENT DOCUMENTS

| | | | | |
|---|---|---|---|---|
| 5,391,985 A | * | 2/1995 | Henley | 348/126 |
| 5,585,735 A | * | 12/1996 | Takahashi et al. | 359/257 |
| 6,034,683 A | * | 3/2000 | Mansour et al. | 715/764 |
| 2004/0218249 A1 | * | 11/2004 | Kochergin | 359/280 |
| 2009/0057536 A1 | * | 3/2009 | Hirose | 250/208.1 |

FOREIGN PATENT DOCUMENTS

| | | | |
|---|---|---|---|
| JP | 04-121673 A | | 4/1992 |
| JP | 04121673 A | * | 4/1992 |
| JP | 2008-020304 A | | 1/2008 |
| JP | 2008-020305 A | | 1/2008 |
| JP | 2008020304 A | * | 1/2008 |
| JP | 2008020305 A | * | 1/2008 |

OTHER PUBLICATIONS

British Office Action dated Nov. 17, 2010 (in English) in counterpart British Application No. GB 1013586.1.

* cited by examiner

*Primary Examiner* — Nhan T Tran (74) *Attorney, Agent, or Firm* — Holtz, Holtz, Goodman & Chick, PC (57) ABSTRACT

An electromagnetic field high speed imaging apparatus, using an image sensing element having a filter function for each pixel, converts a local polarization state in detection light containing a difference frequency component $\Delta f$ ($|fLO-fRF|$) between the modulation frequency $fLO$ of irradiated light and the frequency $fRF$ of the electromagnetic field emitted from a subject into local intensity of light, and captures it by an image sensor of an imaging unit to generate a two-dimensional image of distribution of the near electromagnetic field emitted from the subject. Each pixel of the image sensor comprises a photoelectric conversion element for converting the detection light from the optical unit into an electric charge, a plurality of charge storages, and a charge splitting part for dividing the electric charge generated in the photoelectric conversion element between the plurality of charge storages.

6 Claims, 11 Drawing Sheets

ELECTROMAGNETIC FIELD HIGH SPEED IMAGING APPARATUS

BACKGROUND OF THE INVENTION

1. Technical Field

The present invention relates to an electromagnetic field high speed imaging apparatus that captures distribution information of an electromagnetic field emitted from a subject at high speed to visualize as a two-dimensional image.

2. Description of the Related Art

In recent years, as electronic devices are becoming advanced, smaller, and higher in speed, plated-printed circuits are advancing in fineness and density, and at the same time, subject electric signals are becoming remarkably higher in speed and wider in band. For example, while integrated circuits, mobile devices, and so on which operate at very high frequencies higher than 1 GHz are being developed, difficulty in design due to electromagnetic interference between circuits is becoming noticeable as a problem with technology of circuits operating at such high frequencies. Because by ascertaining the distribution of the electromagnetic field generated when a high frequency circuit operates, redesign for avoiding a problematic point or so on can be efficiently performed, various near electromagnetic field measuring apparatuses have been proposed.

Among these near electromagnetic field measuring apparatuses, there is an apparatus wherein its electromagnetic field measuring probe is placed in a near electromagnetic field and a detection current thereby generated in the probe is led to by a cable. However, because the detection current flowing through the probe placed near a subject and the cable connected thereto affects the near electromagnetic field of the subject, this apparatus is not suitable to perform highly accurate measurement.

Accordingly, an optical fiber end magnetooptic probe system has been proposed wherein a magnetooptic probe having a magnetooptic crystal fixed to an end of an optical fiber is placed in the electromagnetic field of a subject, wherein light is transmitted to the magnetooptic crystal in the magnetooptic probe end via the optical fiber and irradiated onto the magnetooptic crystal that is subjected to the near electromagnetic field to be modulated, and wherein reflected modulated light is analyzed with a spectrum analyzer, thereby measuring the electromagnetic field at the end position of the magnetooptic probe. This system is disclosed in, for example, Japanese Patent Kokai Nos. 2008-020304 (Patent Literature 1) and 2008-020305 (Patent Literature 2).

SUMMARY OF THE INVENTION

However, the imaging apparatuses disclosed in Patent Literatures 1 and 2 need a high speed and low noise camera, and their image processing unit needs digital signal processing using a large scale DSP or the like, resulting in the entire apparatus being expensive.

Hence, an object of the present invention is to realize the imaging unit and the image processing unit in an electromagnetic field high speed imaging apparatus so as to be inexpensive, lower in power consumption, and smaller in size.

In order to solve the above problem, the present invention, instead of filtering in light of a specific frequency component for generating a near electromagnetic field distribution image by a high speed image sensing element and digital signal processing, uses an image sensing element having a filter function for each pixel to realize the imaging apparatus.

Further, because there is provided a circuit for eliminating a DC light component of the electric charges split between a plurality of charge storages of the image sensing element, which component is accumulated evenly across all the charge storages, this invention can prevent the saturation of entered light.

That is, according to an aspect of the present invention, there is provided an electromagnetic field high speed imaging apparatus including a lighting unit capable of outputting modulated light amplitude-modulated with a modulation frequency fLO; a probe unit comprising an electrooptic element or magnetooptic element whose birefringence characteristic locally changes due to the electric field or the magnetic field of a subject frequency fRF emitted from a subject that is a measurement subject, thereby causing a local polarization state to occur in the modulated light irradiated thereon from the lighting unit and which has the modulated light further modulated by a near electromagnetic field of the subject frequency fRF for frequency mixing so as to produce detection light containing a difference frequency component $\Delta f$ between the modulation frequency fLO of the modulated light and the subject frequency fRF; an optical unit that converts the local polarization state in the detection light produced by the probe unit into local intensity of light and image-forms the detection light subjected to the local intensity conversion; an imaging unit comprising an image sensor having an image pickup surface located at a position where the detection light is image-formed by the optical unit and formed of a plurality of pixels, which sensor photoelectric-converts the detection light; and a processing unit that analyzes electric signals from the image sensor of the imaging unit and generates information containing a two-dimensional image of distribution of the near electromagnetic field emitted from the subject. Each of the pixels of the image sensor of the imaging unit comprises a photoelectric conversion element for converting the detection light from the optical unit into an electric charge, a plurality of charge storages, and a charge splitting part for dividing the electric charge generated in the photoelectric conversion element between the plurality of charge storages. By this means, the function of filtering intensity-modulated light of any frequency in, which function is implemented conventionally by a high speed image sensing element and digital signal processing, can be implemented in the image sensing element.

Further, according to another aspect of the present invention, in the electromagnetic field high speed imaging apparatus, the charge splitting part divides the electric charge generated in the photoelectric conversion element between the plurality of charge storages synchronously with the difference frequency component $\Delta f$ produced by the probe unit, thereby extracting only the difference frequency component $\Delta f$ between the modulation frequency fLO of light irradiated from the lighting unit and the subject frequency fRF emitted from a subject that is a measurement subject, from intensity-modulated light containing near electromagnetic field distribution information produced by the probe unit. Hence, by changing the modulation frequency fLO of the irradiated light, the two-dimensional distribution of any frequency component of the electromagnetic field emitted from the subject can be observed.

According to yet another aspect of the present invention, in the electromagnetic field high speed imaging apparatus, the imaging unit further comprises a plurality of capacitors that each can be conductively connected to the plurality of charge storages, and capacitor connection control parts for controlling conduction states between the plurality of charge storages and the plurality of capacitors. By this means, mainly a DC light component accumulated evenly across the plurality of charge storages can be eliminated.

According to still another aspect of the present invention, in the electromagnetic field high speed imaging apparatus, the processing unit generates a control signal to remove the other charge than a charge component synchronous with the difference frequency component Δf produced by the probe unit based on information from the imaging unit so as to control conduction states between the charge storages and the plurality of capacitors of the imaging unit. By this means, the difference frequency component Δf that is a measurement subject and the other components can be efficiently separated, thus improving measurement accuracy.

The present invention, with the structure described above, does not need a high speed and low noise camera and digital signal processing using a large scale DSP or the like that are conventionally used, and the same processing can be executed in the image sensing element alone.

In general, since the cost of the image sensing element mainly depends on the quantity in mass production, the difference in cost, due to the functional difference, between the conventional high-speed and low-noise image sensing element and the image sensing element used in this invention is small. Therefore, because a digital signal processing unit using a large scale DSP or the like is not needed, the present invention can be implemented more inexpensively.

Also, because a digital signal processing unit is not needed, the effect of being lower in power consumption and smaller in size can be expected. Therefore, by the present invention, the same electromagnetic field high speed imaging apparatus as the conventional one can be realized so as to be inexpensive, lower in power consumption, and smaller in size.

DETAILED DESCRIPTION OF THE INVENTION

An electromagnetic field high speed imaging apparatus according to an embodiment of the present invention will be described below using the drawings.

Figure 1:
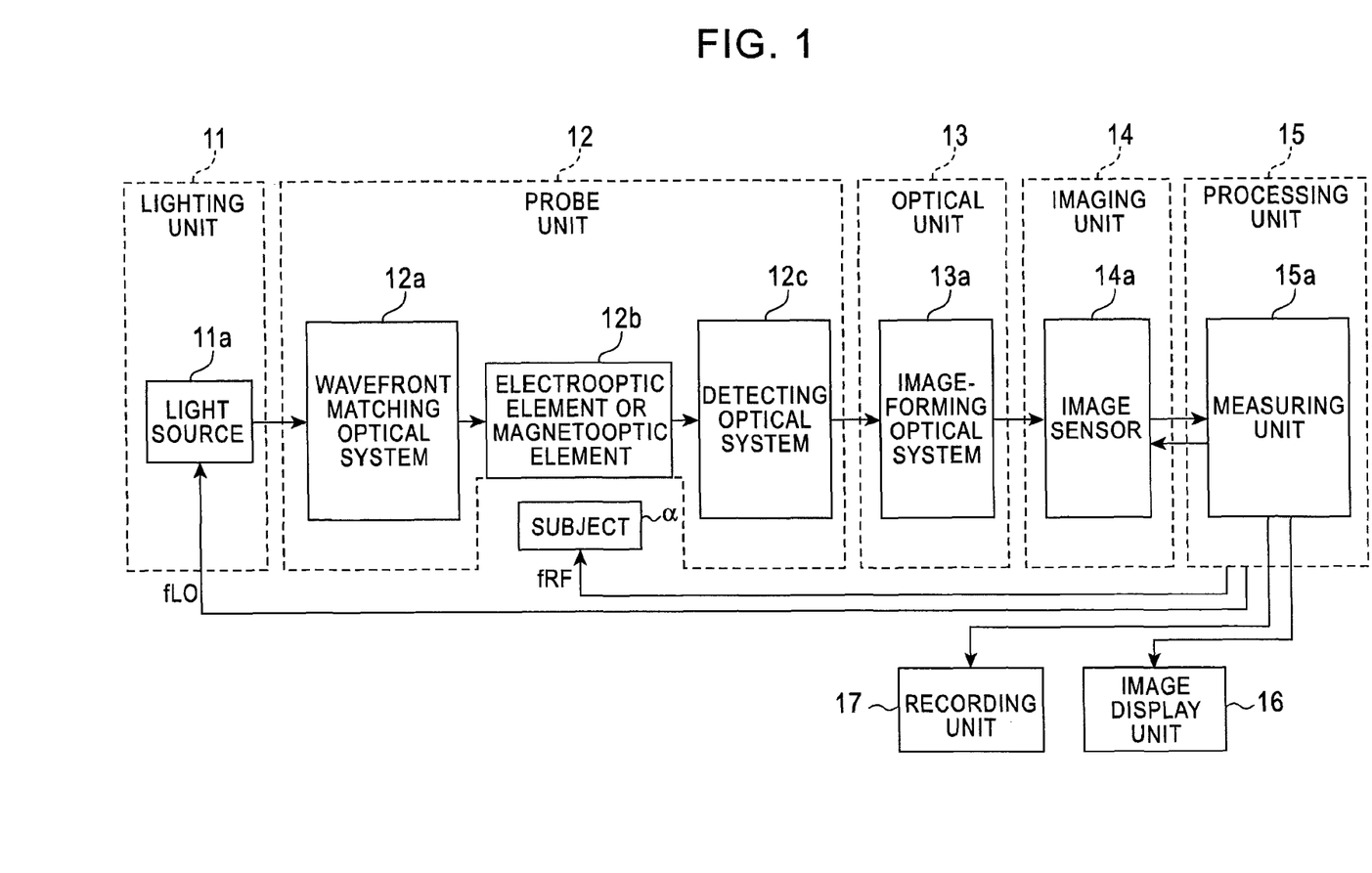
FIG. 1 is a schematic function block diagram of an electromagnetic field high speed imaging apparatus according to an embodiment of the present invention.

FIG. 1 is a configuration block diagram of an electromagnetic field high speed imaging apparatus 10.

The electromagnetic field high speed imaging apparatus 10 comprises a lighting unit 11, a probe unit 12, an optical unit 13, an imaging unit 14, a processing unit 15, an image display unit 16, and a recording unit 17.

The lighting unit 11 comprises a laser light source 11a of, e.g., 780 nm in wavelength, and a light intensity modulator (MZM: Mach-Zhender Modulator) (not shown) provided on the optical axis of output light from the light source and intensity-modulating the laser light into modulated light. Let fLO be the modulation frequency.

Because its birefringence characteristic locally changes due to the electric field or the magnetic field emitted from a subject α that is a measurement subject, the probe unit 12 causes a local polarization state to occur in the modulated light irradiated from the lighting unit 11 and outputs detection light, of which the polarization state has been converted into intensity change. After the irradiated modulated light is modulated by the near electromagnetic field having a subject frequency fRF of the subject α, the probe unit 12 outputs the resultant light. Its constituents will be described later.

The optical unit 13 is constituted by an image-forming optical system 13a for image-forming the detection light, and image-forms the output light of the probe unit 12 on the image pickup surface of an image sensor having a plurality of pixels (described later).

The imaging unit 14 comprises an image sensor 14a, which receives light image-formed by the optical unit 13, the light being the detection light having a local intensity distribution of the electric field or magnetic field captured by the probe unit 12, and outputs an intensity signal of the modulated light of a predetermined frequency band.

The processing unit 15 comprises a measuring unit 15a that outputs a two-dimensional image of the electromagnetic field based on the intensity signal output from the image sensor 14a of the imaging unit 14.

The image display unit 16 visualizes and displays the two-dimensional image output from the processing unit 15. The recording unit 17 stores the two-dimensional image produced by the processing unit 15.

The probe unit 12 comprises a wavefront matching optical system 12a that receives the modulated light from the lighting unit 11, an electrooptic element (EO crystal) or a magnetooptic element (MO crystal) 12b that receives the modulated light from the wavefront matching optical system 12a, a detecting optical system 12c that receives the modulated light further modulated in the electrooptic element or magnetooptic element 12b, and a mechanism (not shown) that supports them and adjusts optical conditions and the like.

The electrooptic element or magnetooptic element 12b is placed in the vicinity of the subject α so as to be subjected to the electromagnetic field of the subject frequency fRF emitted from the subject α, the vicinity referring to the narrow space of about one wavelength around the subject α, which is also called an evanescent electric field, evanescent field, or near field. The wavefront matching optical system 12a makes the wavefront of the modulated light to be incident on the electrooptic element or magnetooptic element 12b be the most suitable for detecting the electromagnetic field.

The detecting optical system 12c extracts components subjected to the electromagnetic field from the output light from the electrooptic element or magnetooptic element 12b.

Because its birefringence characteristic changes due to the electric field or magnetic field (near electromagnetic field) emitted by the subject α, the electrooptic element or magnetooptic element 12b of the probe unit 12 thus gives a polarization distribution according to the electromagnetic field distribution to a light beam that passes through or is reflected. Further, the electrooptic element and the magnetooptic element are extremely fast in time response and has high enough frequency responsiveness to follow the subject frequency fRF of the near electromagnetic field emitted by the subject α, and thus the polarization distribution is responsive to the subject frequency fRF (operating frequency) of the near electromagnetic field of the subject α.

The image sensor 14a of the imaging unit 14, which receives the detection light having a local intensity distribution of the electric field or magnetic field, comprises a photoelectric conversion part, a charge storage part, a charge splitting part, an output part, etc. (not shown), and filters intensity modulated light of a specific frequency in and outputs a sine component and a cosine component of the specific frequency.

The measuring unit 15a of the processing unit 15 calculates the intensity and phase of the near electromagnetic field based on the sine and cosine components of the specific frequency output by the imaging unit 14 and outputs them as two-dimensional image data to the image display unit 16.

The image display unit 16 receiving image information from the measuring unit 15a displays phase information and amplitude information of the near electromagnetic field that changes with time for each pixel as changes in hue and concentration, and changes in the near electromagnetic field emitted by the subject α can be viewed as moving images. The recording unit 17 storing image information from the measuring unit 15a as needed may have a playback function for recorded images or operations and have the image display unit 16 display them.

Figure 2:
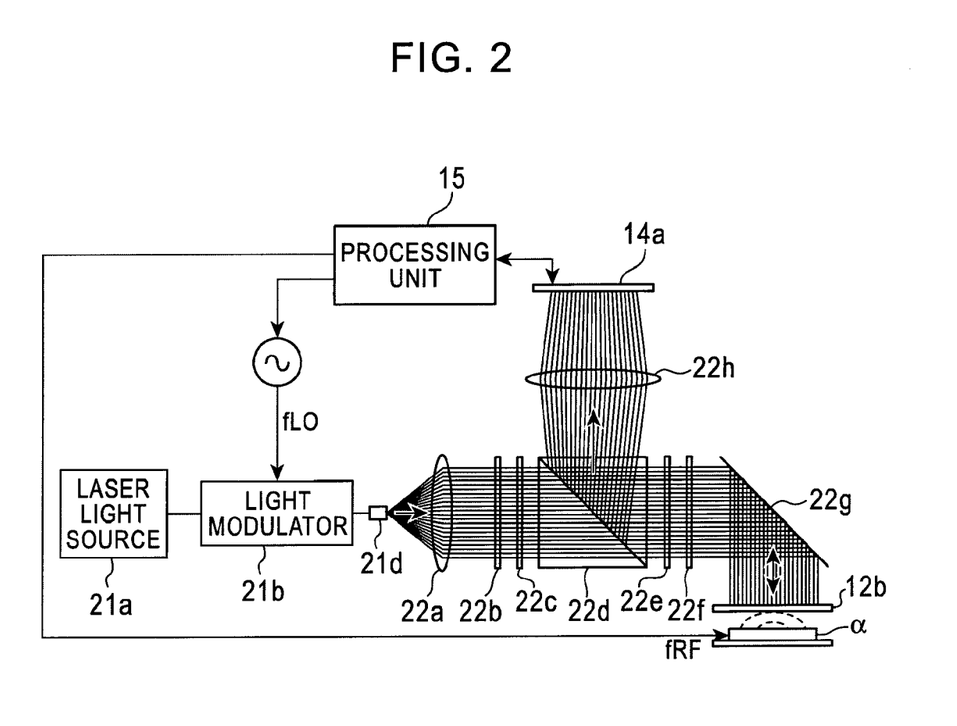
FIG. 2 is a schematic configuration diagram showing an example of the electromagnetic field high speed imaging apparatus according to the embodiment of the present invention.

FIG. 2 is a schematic configuration diagram of the electromagnetic field high speed imaging apparatus 10 shown in FIG. 1 and particularly shows in detail an example configuration of the wavefront matching optical system, the detecting optical system, and the image-forming optical system.

In FIG. 2, a fiber end 21d, a collimator lens 22a, a ¼ wavelength plate 22b, a ½ wavelength plate 22c, a polarization beam splitter 22d, a ¼ wavelength plate 22e, a ½ wavelength plate 22f, and a dielectric mirror 22g arranged on the optical axis together function as the wavefront matching optical system.

The plate-shaped electrooptic element or magnetooptic element 12b functions as a probe. The electrooptic element or magnetooptic element 12b is placed opposite and parallel to the subject α emitting an electromagnetic field of microwaves to millimeter waves (several hundred MHz to several tens GHz) such as an electronic circuit board or a planar antenna.

The polarization beam splitter 22d, the ¼ wavelength plate 22e, and the ½ wavelength plate 22f function as the detecting optical system.

An image-forming lens 22h functions as the image-forming optical system that image-forms modulated light from the polarization beam splitter 22d of the detecting optical system on the image sensor 14a.

In this example configuration, the polarization beam splitter 22d, the ¼ wavelength plate 22e, and the ½ wavelength plate 22f function in a plurality of ways, i.e., as part of the wavefront matching optical system when light travels rightward in the figure and as the detecting optical system when light travels leftward.

The polarization plane is sequentially matched by the wavefront matching optical system of the optical system in FIG. 2, and the detecting optical system converts the polarization state of the wavefront into the intensity of light. By rotating the polarization beam splitter 22d around the optical axis relatively with respect to the electric field, its output can be changed.

In FIG. 2, laser light emitted from a laser light source 21a is led by an optical fiber to a light modulator 21b controlled by the modulation frequency fLO supplied from a high frequency oscillator 21c, and modulated light having its amplitude modulated is emitted diffusely from the fiber end 21d and made to be parallel rays by the collimator lens 22a. Then, the modulated laser light passes through a wavefront matching optical system formed of the ¼ wavelength plate 22b and the ½ wavelength plate 22c to become circularly polarized, travels straight through the polarization beam splitter 22d, passes through the ¼ wavelength plate 22e and the ½ wavelength plate 22f, and then with the optical axis being bent by the dielectric mirror 22g, is made incident perpendicularly on the light irradiation surface of the electrooptic element or magnetooptic element 12b placed at a predetermined position by a holding mechanism. That is, in this example configuration, the ¼ wavelength plate 22b, the ½ wavelength plate 22c, the polarization beam splitter 22d, the ¼ wavelength plate 22e, and the ½ wavelength plate 22f function as a wavefront matching optical system.

The modulated light irradiated on the light irradiation surface of the electrooptic element or magnetooptic element 12b via the dielectric mirror 22g is modulated in local polarization state by the electric field emitted by the subject α operating at the operating frequency fRF, is reflected to be detection light containing a difference frequency component Δf, and travels along the optical path in the opposite direction to that in irradiation. Unlike the modulated light, the detection light is reflected in the polarization beam splitter 22d as an analyzer upwardly in the figure with polarization state modulation being converted into intensity modulation and is image-formed on the image pickup surface of the image sensor 14a by the image-forming lens 22h.

The modulated light of the modulation frequency fLO being incident thereon, the modulated light reflected from the electrooptic element or magnetooptic element 12b has had its wavelength and phase changed. Because this change depends on the intensity and frequency of the electric field emitted by the subject α that is a measurement subject, and the electrooptic element or magnetooptic element 12b and the subject α are planar and parallel to each other, this change contains information about electric field planar distribution. Let fRF be the subject frequency of the electric field of the subject α that is a measurement subject.

Further, lights before and after being incident on the electrooptic element or magnetooptic element 12b are mixed by the polarization beam splitter 22d. Thus, the mixed light contains a side band component including a component of |fLO−fRF|, as well as components of the modulation frequency fLO and the subject frequency fRF. By adjusting the modulation frequency fLO relative to the subject frequency fRF of interest, an arbitrary |fLO−fRF| side band can be produced. This |fLO−fRF| component contains electric field information of the subject α. By adjusting the frequency |fLO−fRF| to be a relatively low frequency, a two-dimensional image containing the electric field information of the subject α can be captured by the imaging unit 14.

Figure 3:
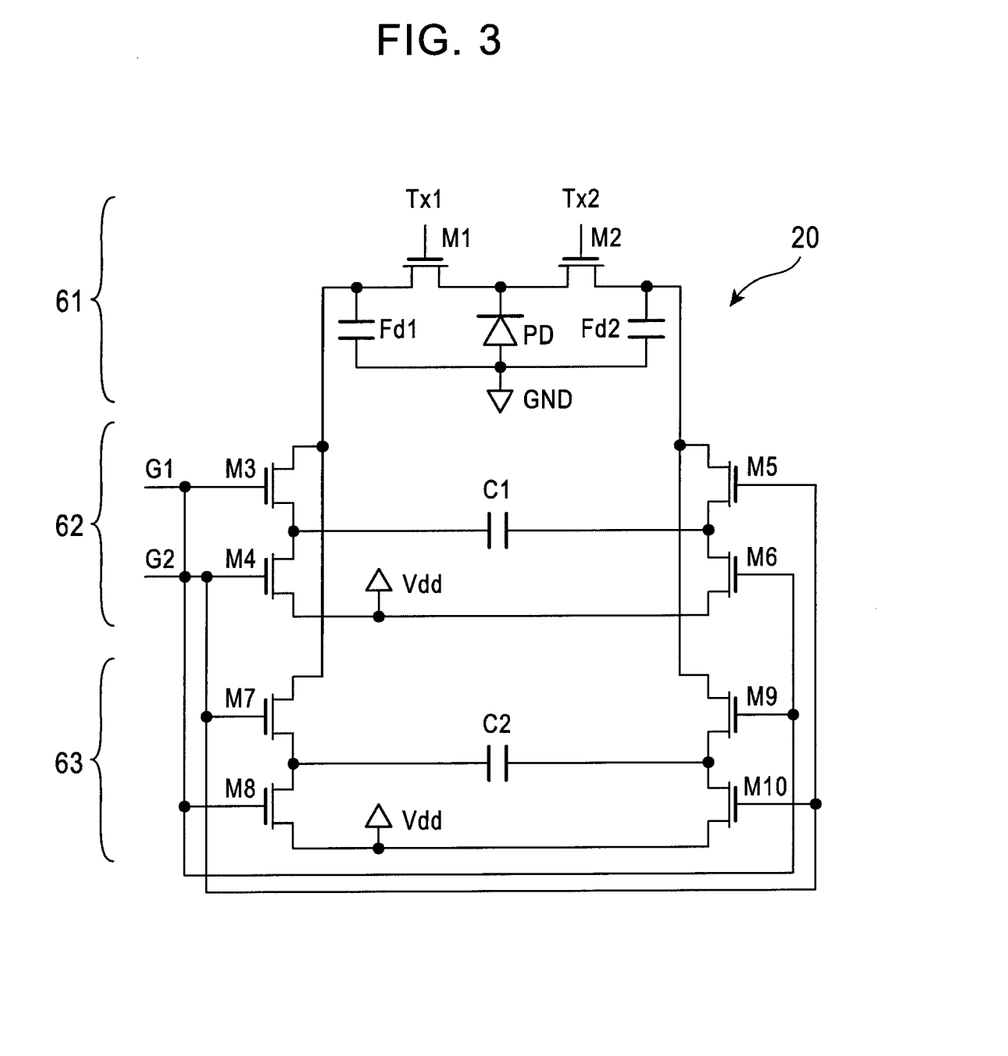
FIG. 3 is a circuit diagram showing an example of a solid-state image sensing element for a pixel of an image sensor of an imaging unit in the electromagnetic field high speed imaging apparatus according to the embodiment of the present invention.

FIG. 3 is a circuit diagram of a solid-state image sensing element 20 used as a pixel of the image sensor 14a of the imaging unit 14 according to the embodiment of the present invention.

The solid-state image sensing element 20 shown in FIG. 3 is used as one of the elements constituting the pixels of the image sensor 14a shown in FIG. 1.

In the solid-state image sensing element 20 shown in FIG. 3, the entered light is converted into an electric charge by a photoelectric conversion element PD, i.e., a photodiode.

The solid-state image sensing element 20 shown in FIG. 3 comprises a separating-accumulating part 61 that separates and accumulates electric charges of photoelectrons that occur due to the photoelectric conversion element PD receiving light, synchronously with the modulated light irradiated from the lighting unit 11 onto the element 12b, and first and second capacitor connection control parts 62 and 63 for switching capacitor connections.

The separating-accumulating part 61 comprises a photoelectric conversion element PD connected to a plurality of storage capacitors, that is, a first charge storage Fd1 and a second charge storage Fd2 respectively via a first FET switch M1 and a second FET switch M2. Thus, by controlling voltages applied to the gate of the first FET switch M1, i.e., a first transfer gate Tx1 and the gate of the second FET switch M2, i.e., a second transfer gate Tx2 individually, an electric charge generated in the photoelectric conversion element PD can be divided between the first charge storage Fd1 and the second charge storage Fd2 and accumulated.

Figure 4:
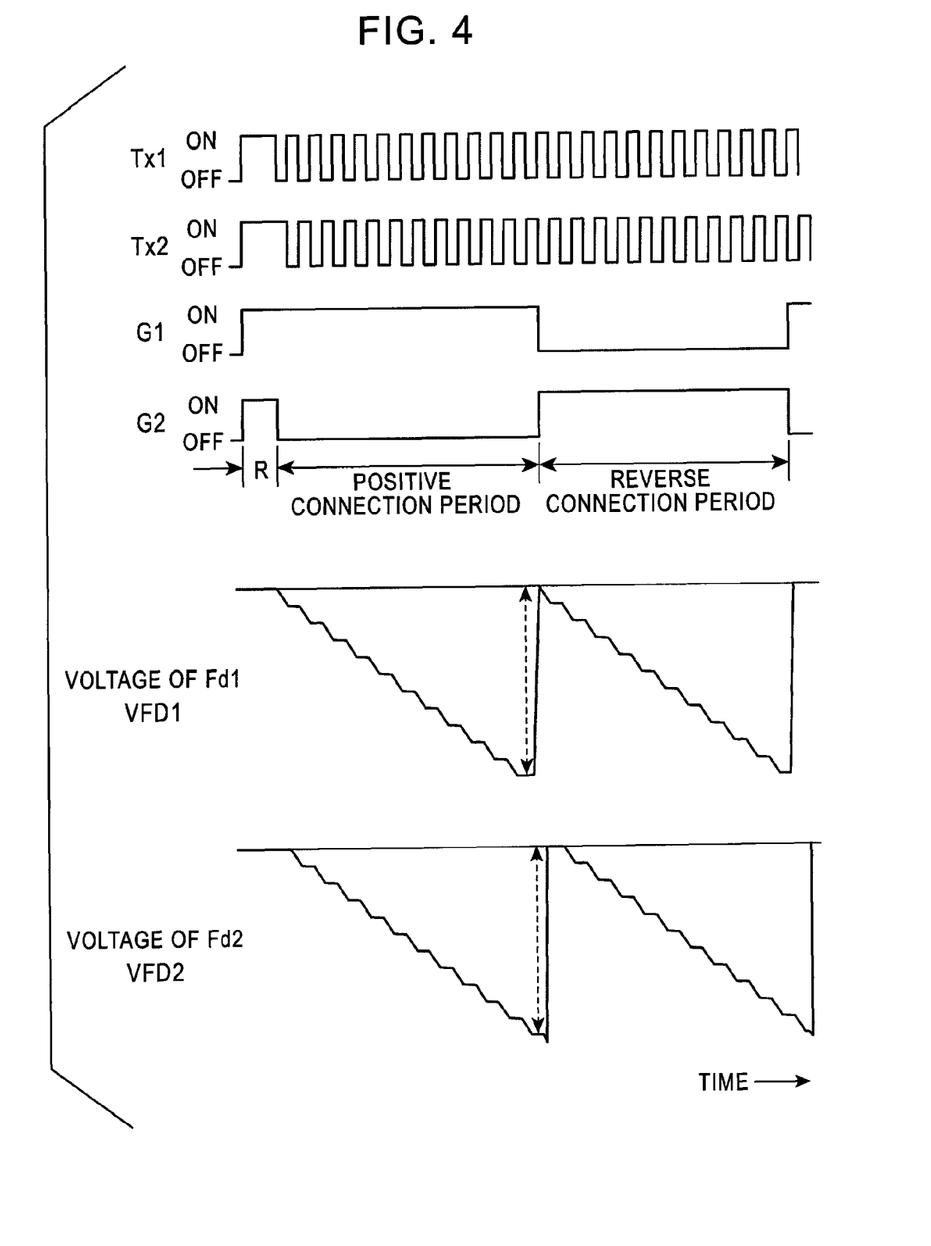
FIG. 4 is a timing chart of drive signals of the imaging unit in the electromagnetic field high speed imaging apparatus according to the embodiment of the present invention.

The first transfer gate Tx1 and the second transfer gate Tx2 are controlled to be ON and OFF according to an external synchronizing signal such as the difference frequency component Δf between the modulation frequency fLO of the modulated light irradiated from the lighting unit 11 and the subject frequency fRF of the electric field or the magnetic field emitted from the subject α, and split the electric charge generated due to the detection light from the optical unit 13. As shown in FIG. 4, control pulse signals opposite in phase to each other, of which the frequency is the difference frequency component Δf and the duty ratio is 50%, are respectively applied to the first transfer gate Tx1 and the second transfer gate Tx2 after a reset period R described later.

Because an electric charge caused by the modulated light component of the difference frequency component Δf contained in the detection light from the optical unit 13, is divided between the first charge storage Fd1 and the second charge storage Fd2 so as to store an amount of charge corresponding to the phase, the amounts of charge stored in the first charge storage Fd1 and the second charge storage Fd2 are different. However, for other frequency components than the difference frequency component Δf such as a DC light component, the electric charge is divided equally between the first and second charge storages Fd1 and Fd2.

The first capacitor connection control part 62 comprises a first capacitor C1, a third FET switch M3, a fourth FET switch M4, a fifth FET switch M5, a sixth FET switch M6, and a first power supply Vdd to apply a bias voltage. The second capacitor connection control part 63 comprises a second capacitor C2, a seventh FET switch M7, an eighth FET switch M8, a ninth FET switch M9, a tenth FET switch M10, and a second power supply Vdd to apply a bias voltage.

The first capacitor C1 of the first capacitor connection control part 62 and the second capacitor C2 of the second capacitor connection control part 63 are respectively connected to the first charge storage Fd1 and the second charge storage Fd2 that are two storage capacitors of the separating-accumulating part 61 via the first to tenth FET switches M1 to M10.

As described above, the solid-state image sensing element 20 is configured to have two capacitor connection control parts each formed of four FET switches and a capacitor (the first and second capacitor connection control parts 62 and 63) added to the separating-accumulating part 61.

That is, in the first capacitor connection control part 62, the third FET switch M3-the fourth FET switch M4 and the fifth FET switch M5-the sixth FET switch M6 are arranged symmetrical with the first capacitor C1 being sandwiched in between.

Here, the third FET switch M3 and the sixth FET switch M6 are driven by the same gate signal G1 of a first gate G1, while the fourth FET switch M4 and the fifth FET switch M5 are driven by the same gate signal G2 of a second gate G2.

Likewise, in the second capacitor connection control part 63, the seventh FET switch M7-the eighth FET switch M8 and the ninth FET switch M9-the tenth FET switch M10 are arranged symmetrical with the second capacitor C2 being sandwiched in between.

Here, the eighth FET switch M8 and the ninth FET switch M9 are driven by the same gate signal G1 of the first gate G1, while the seventh FET switch M7 and the tenth FET switch M10 are driven by the same gate signal G2 of the second gate G2.

Thus, both ends of the first capacitor C1 and the second capacitor C2 are selectively connected to the first charge storage Fd1, the second charge storage Fd2, the first power supply Vdd, and the second power supply Vdd via the third to tenth FET switches M3 to M10.

Note that the first charge storage Fd1 and the second charge storage Fd2 are, for example, capacitors formed in a semiconductor substrate by impurity diffusion, and that the first capacitor C1 and the second capacitor C2 are, for example, capacitors formed between metal line layers.

It is assumed that the first charge storage Fd1 and the second charge storage Fd2 are equal in capacitance and that the first capacitor C1 and the second capacitor C2 are equal in capacitance.

The first charge storage Fd1 (the second charge storage Fd2) and the first capacitor C1 (the second capacitor C2) do not necessarily need to be equal in capacitance, but are preferably set to be equal.

Next, the operation of the solid-state image sensing element 20 will be described with reference to FIG. 4 that is an illustrative diagram of the operation principle.

FIG. 4 is a timing chart showing changes in the voltages of the first gate G1, the second gate G2, the first charge storage Fd1, and the second charge storage Fd2. In FIG. 4, time passes from the left to the right. For the description below, let VFD1 be the voltage of the first charge storage Fd1 and VFD2 be the voltage of the second charge storage Fd2 (broken-line arrows).

First, a voltage is applied to all of the first transfer gate Tx1, the second transfer gate Tx2, the first gate G1, and the second gate G2 for a period of time, which is called a reset period R.

During this reset period R, because all of the first to tenth FET switches M1 to M10 are conductive, the terminals of the first charge storage Fd1 and the second charge storage Fd2 are made to be at Vdd potential. The potential of the photoelectric conversion element PD is reset to potential corresponding to the voltage applied to the first transfer gate Tx1 and the second transfer gate Tx2, and the first capacitor C1 and the second capacitor C2 is reset to be in a discharged state.

Note that the above reset is performed at the beginning of reading out from a line to which the pixel constituted by the solid-state image sensing element 20 belongs.

After the reset period R passes, until the next reset, high speed drive pulse signals to split and accumulate electric charges of photoelectrons that occur due to the photoelectric conversion element PD receiving light synchronously with the modulated light, are applied to the first transfer gate Tx1 and the second transfer gate Tx2 as shown in FIG. 4, and pulse voltages inverted from each other and equal in time length are continuously applied to the first gate G1 and the second gate G2 as shown in FIG. 4. By this means, during each connection period, the voltages of the first charge storage Fd1 and the second charge storage Fd2 change gradually, accumulatively.

Here, the period when the voltage is applied to the first gate G1 without the voltage being applied to the second gate G2 is referred to as a positive connection period, and the period when, conversely, the voltage is applied to the second gate G2 without the voltage being applied to the first gate G1 is referred to as a reverse connection period. The time period when an electric charge is divided between the first and second charge storages Fd1, Fd2 and accumulated as mentioned above is referred to as a "charge accumulation time period" as needed.

The time lengths of the positive connection period and the reverse connection period are equal and are an integer multiple of that of high speed pulses applied to the first transfer gate Tx1 and the second transfer gate Tx2.

Figure 5:
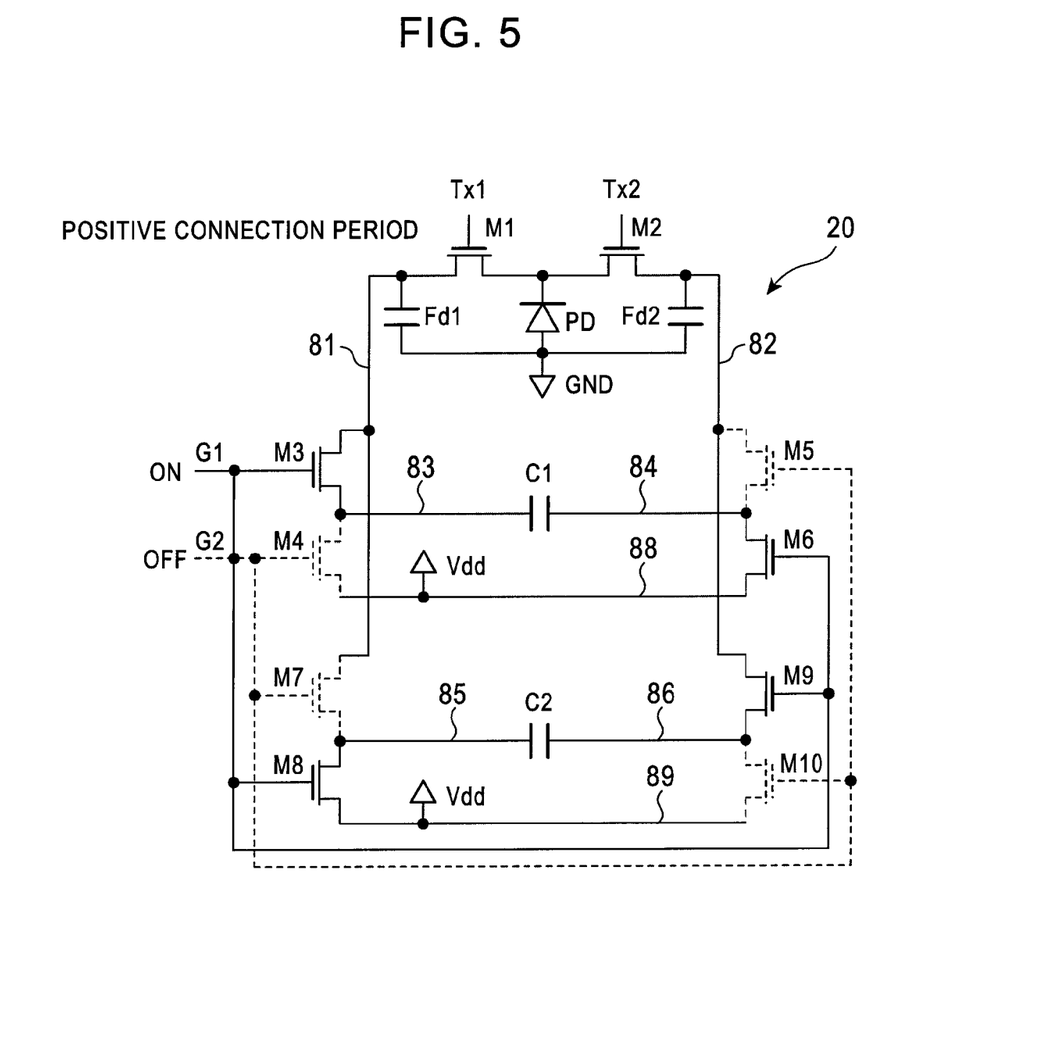
FIG. 5 is a circuit diagram showing the connection states of FET switches in a positive connection period in the electromagnetic field high speed imaging apparatus according to the embodiment of the present invention.

In the positive connection period, because the voltage is applied to the first gate G1 while the voltage is not applied to the second gate G2 as shown in FIG. 5, the third FET switch M3, the sixth FET switch M6, the eighth FET switch M8, and the ninth FET switch M9 are each conductive (indicated by solid lines in FIG. 5), and the fourth FET switch M4, the fifth FET switch M5, the seventh FET switch M7, and the tenth FET switch M10 are each nonconductive (indicated by broken lines in FIG. 5).

Thus, lead 81 and lead 83 are connected and lead 84 and lead 88 are connected, so that the first charge storage Fd1 and the first capacitor C1 are connected equivalently in parallel with each other. Likewise, lead 82 and lead 86 are connected and lead 85 and lead 89 are connected, so that the second charge storage Fd2 and the second capacitor C2 are connected equivalently in parallel with each other. Thus, in the positive connection period in the charge accumulation time period, the electric charge of the first charge storage Fd1 moves to the left end of the first capacitor C1, and the electric charge of the second charge storage Fd2 moves to the right end of the second capacitor C2.

Figure 6:
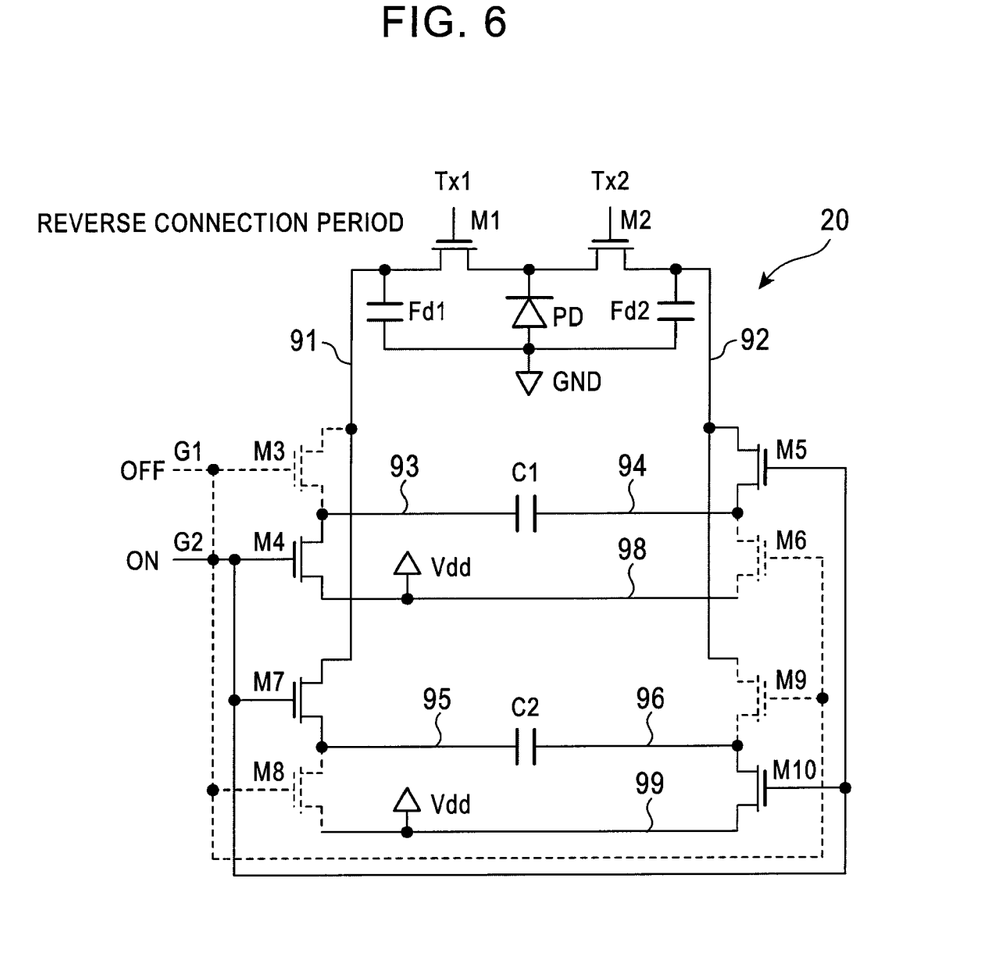
FIG. 6 is a circuit diagram showing the connection states of the FET switches in a reverse connection period in the electromagnetic field high speed imaging apparatus according to the embodiment of the present invention.

In contrast, in the reverse connection period, because the voltage is applied to the second gate G2 while the voltage is not applied to the first gate G1, as shown in FIG. 6, the third FET switch M3, the sixth FET switch M6, the eighth FET switch M8, and the ninth FET switch M9 are each nonconductive (indicated by broken lines in FIG. 6), and the fourth FET switch M4, the fifth FET switch M5, the seventh FET switch M7, and the tenth FET switch M10 are each conductive (indicated by solid lines in FIG. 6). Thus, lead 91 and lead 95 are connected and lead 96 and lead 99 are connected, so that the first charge storage Fd1 and the second capacitor C2 are connected equivalently in parallel with each other. Likewise, lead 92 and lead 94 are connected and lead 93 and lead 98 are connected, so that the second charge storage Fd2 and the first capacitor C1 are connected equivalently in parallel with each other.

Note that the first capacitor C1 and the second capacitor C2 are each connected to the first charge storage Fd1 and the second charge storage Fd2 in opposite polarity between the positive connection period and the reverse connection period. Hence, in the reverse connection period in the charge accumulation time period, the electric charge of the first charge storage Fd1 moves to the left end of the second capacitor C2, and the electric charge of the second charge storage Fd2 moves to the right end of the first capacitor C1 so as to cancel out the electric charge accumulated in the positive connection period.

As described above, in the charge accumulation time period, two operations are simultaneously performed, which are a charge splitting operation of opening and closing alternately the first and second transfer gates Tx1, Tx2 of the FET switches so as to divide the electric charge from the photoelectric conversion element PD between the first and second charge storages Fd1, Fd2, and a charge cancellation operation of switching (or toggling) the ON/OFF of the gate signals G1, G2 for the FET switches of the first and second capacitor connection control parts 62, 63 to switch between the positive connection period and the reverse connection period so as to prevent charge saturation. In other words, if their capacitances are equal, in each of the positive connection period and the reverse connection period, the flowing-in electric charge is divided equally between the first charge storage Fd1-the first capacitor C1 and the second charge storage Fd2-the second capacitor C2. The positive connection period passes, and when immediately thereafter the pulse signals applied to the first and second gates are inverted from each other, the charge accumulated in the first capacitor C1 flows into the second charge storage Fd2, and the charge accumulated in the second capacitor C2 flows into the first charge storage Fd1. Because connection polarity is opposite between the first capacitor C1 and the second capacitor C2, most of the charge is neutralized, not added.

Let $\Delta QFd1$ be the charge that has flowed into the first charge storage Fd1 in the positive connection period according to the pulse voltages applied to the transfer gates shown in FIG. 4 and $\Delta QFd2$ be the charge that has flowed into the second charge storage Fd2. When $\Delta QFd1=\Delta QFd2$, the voltages of the first and second charge storages Fd1, Fd2 shown in the lower part of FIG. 4 cancel out. In the first charge storage Fd1 and the second charge storage Fd2 and in the first capacitor C1 and the second capacitor C2, only difference components of the flowing-in charge remain, with the same components disappearing due to charge neutralization, and can be read out as the voltages of the first charge storage Fd1 and the second charge storage Fd2.

Figure 7:
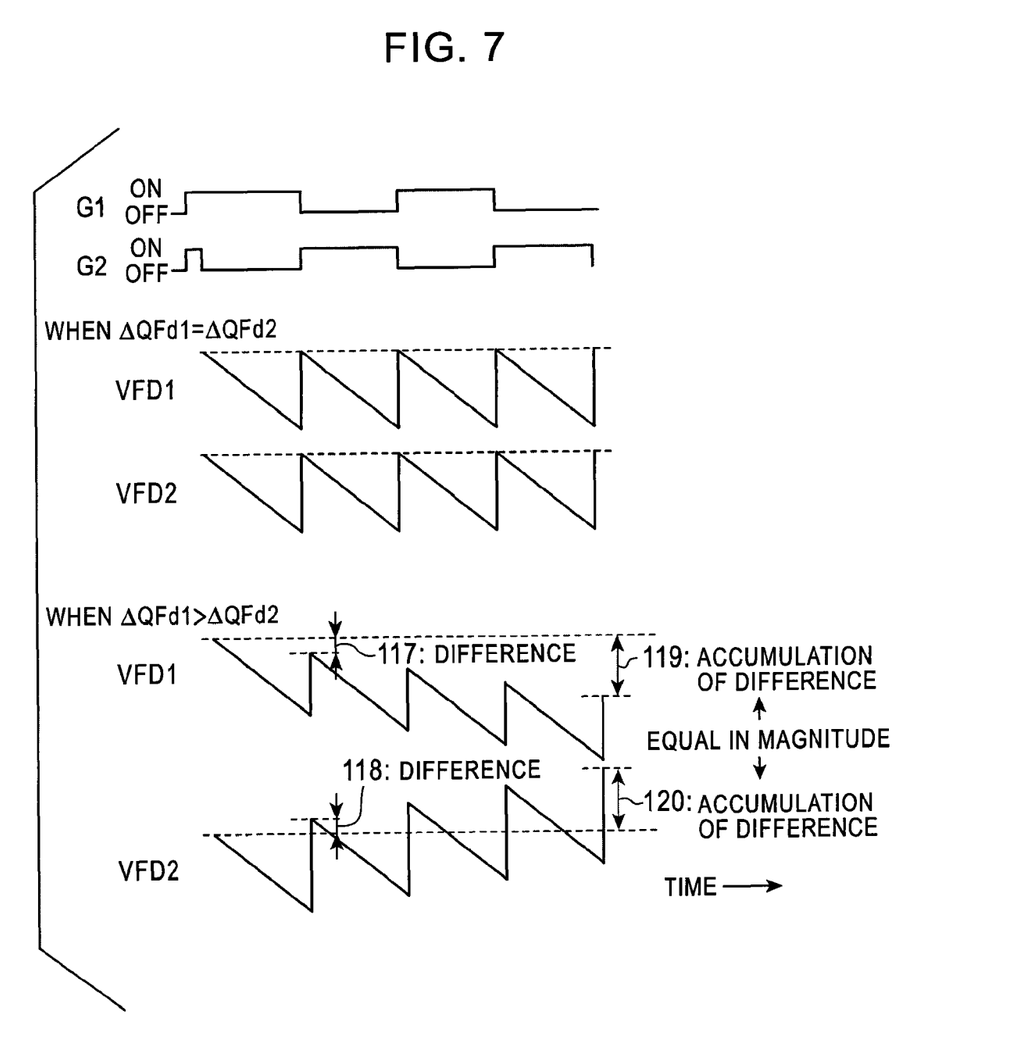
FIG. 7 is a timing chart showing voltage changes of a first storage capacitor Fd1 and a second storage capacitor Fd2 due to repetitions of the positive connection period and the reverse connection period, for explaining operation results of a solid-state image sensing element in the electromagnetic field high speed imaging apparatus according to the embodiment of the present invention.

However, when the positive connection period and the reverse connection period are repeated, if there is a difference between $\Delta QFd1$ and $\Delta QFd2$ (for example, $\Delta QFd1>\Delta QFd2$), the voltages of the first charge storage Fd1 and the second charge storage Fd2 accumulatively change by the amount corresponding to a remaining difference component as shown in FIG. 7 (the voltages being indicated by reference numerals 117, 118, 119, and 120). The difference between ΔQFd1 and ΔQFd2 is not neutralized and remains on the have-more side while it remains subtracted on the have-less side.

Hence, by reading out the amounts of charge stored in the first charge storage Fd1 and the second charge storage Fd2 by a reading circuit (the processing unit 15) and computing the difference in charge amount between the first and second charge storages, |Fd1−Fd2|, by the processing unit 15, only the phase component and amplitude of the difference frequency component Δf can be extracted.

Thus, with the solid-state image sensing element 20 of a charge splitting scheme, noise can be excluded, and only the difference frequency component Δf from the subject α can be extracted effectively, and thus the electromagnetic field high speed imaging apparatus can be made higher in sensitivity and lower in noise.

FIG. 7 shows the way that in repetitions of the charge splitting operation and the charge cancellation operation, light components of the other frequency components are removed with the modulated light component of the difference frequency component Δf remaining.

Where the positive connection period and the reverse connection period are set equal in time length, the charges equally stored in the first charge storage Fd1 and the second charge storage Fd2 cancel out while the charge caused by the modulated light component of the difference frequency component Δf is split and stored in a ratio corresponding to the phase of Δf. Hence, only the difference component between the first charge storage Fd1 and the second charge storage Fd2 remains in the first capacitor C1 and the second capacitor C2.

However, the process of switching between the positive connection period and the reverse connection period being considered, when switching between the positive connection period and the reverse connection period, the third to tenth FET switches M3 to M10 are switched from on to off or from off to on, and hence, although being slight, switching noise occurs in the third to tenth FET switches M3 to M10.

Because this switching noise is superimposed on the charges stored in the first and second capacitors C1, C2, frequently switching between the positive connection period and the reverse connection period may result in degradation in the S/N ratio.

On the other hand, where the number of times of switching between the positive connection period and the reverse connection period is not enough, if the amount of light of other components than the difference frequency component Δf is large, the first charge storage Fd1 or the second charge storage Fd2 may be saturated. The ratio of the difference frequency component Δf to the other components is experientially about 1000:1.

Accordingly, in order to separate the difference frequency component Δf to be measured and the other components efficiently to improve measurement accuracy, in the embodiment, the processing unit 15 is configured to send the image sensor 14a a control signal to control the number of times of switching between the positive connection period and the reverse connection period to be an optimum value based on the output signal of the image sensor 14a. That is, the processing unit 15 generates a control signal to remove the other charge components than the charge component synchronous with the difference frequency component Δf between the modulation frequency fLO of the modulated light on the electrooptic element or magnetooptic element 12b of the probe unit and the subject frequency fRF based on information from the image sensor 14a of the imaging unit 14, and controls the conduction states between the charge storages and the plurality of capacitors of the imaging unit.

Figure 8:
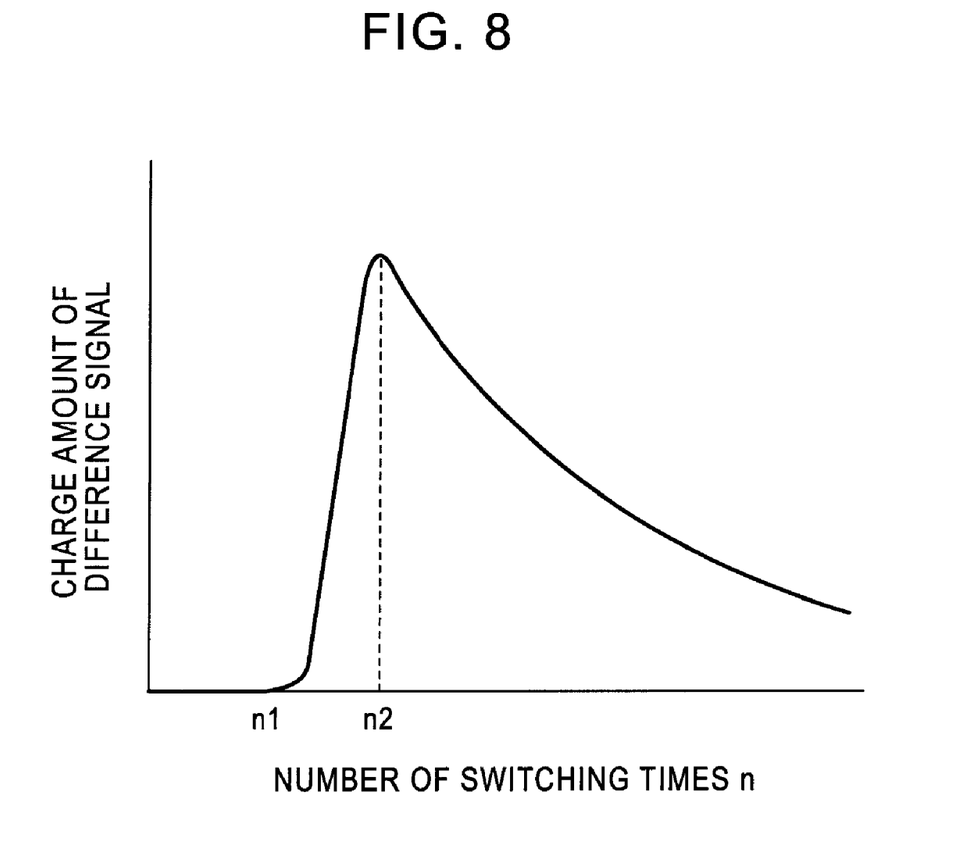
FIG. 8 is a graph showing a relationship between the number of times of switching between the positive connection period and the reverse connection period, and the charge amount of a difference signal of a frequency band of a difference frequency component Δf in the electromagnetic field high speed imaging apparatus according to the embodiment of the present invention.

Next, the optimum value for the number of times of switching between the positive connection period and the reverse connection period will be described. FIG. 8 is a graph showing a relationship between the number of times of switching between the positive connection period and the reverse connection period, and the charge amount of a difference signal of the frequency band of the difference frequency component Δf. The horizontal axis represents the number of switching times n, and the vertical axis represents the intensity of the difference signal.

In a condition where the light amount of the detection light is large enough, when the number of switching times n is small, the first and second charge storages Fd1, Fd2 become saturated, and hence the difference component does not remain and thus is zero. Gradually increasing n, when n becomes equal to n1 (n=n1), the other components than the difference frequency component Δf are removed before the first and second charge storages Fd1, Fd2 become saturated, and hence the difference component becomes detectable. Further increasing n, when n becomes equal to n2 (n=n2), the difference signal component reaches its peak. However, when n>n2, switching noise increases proportionally to the number of switching times, and hence the difference signal gradually decreases in intensity.

Figure 9:
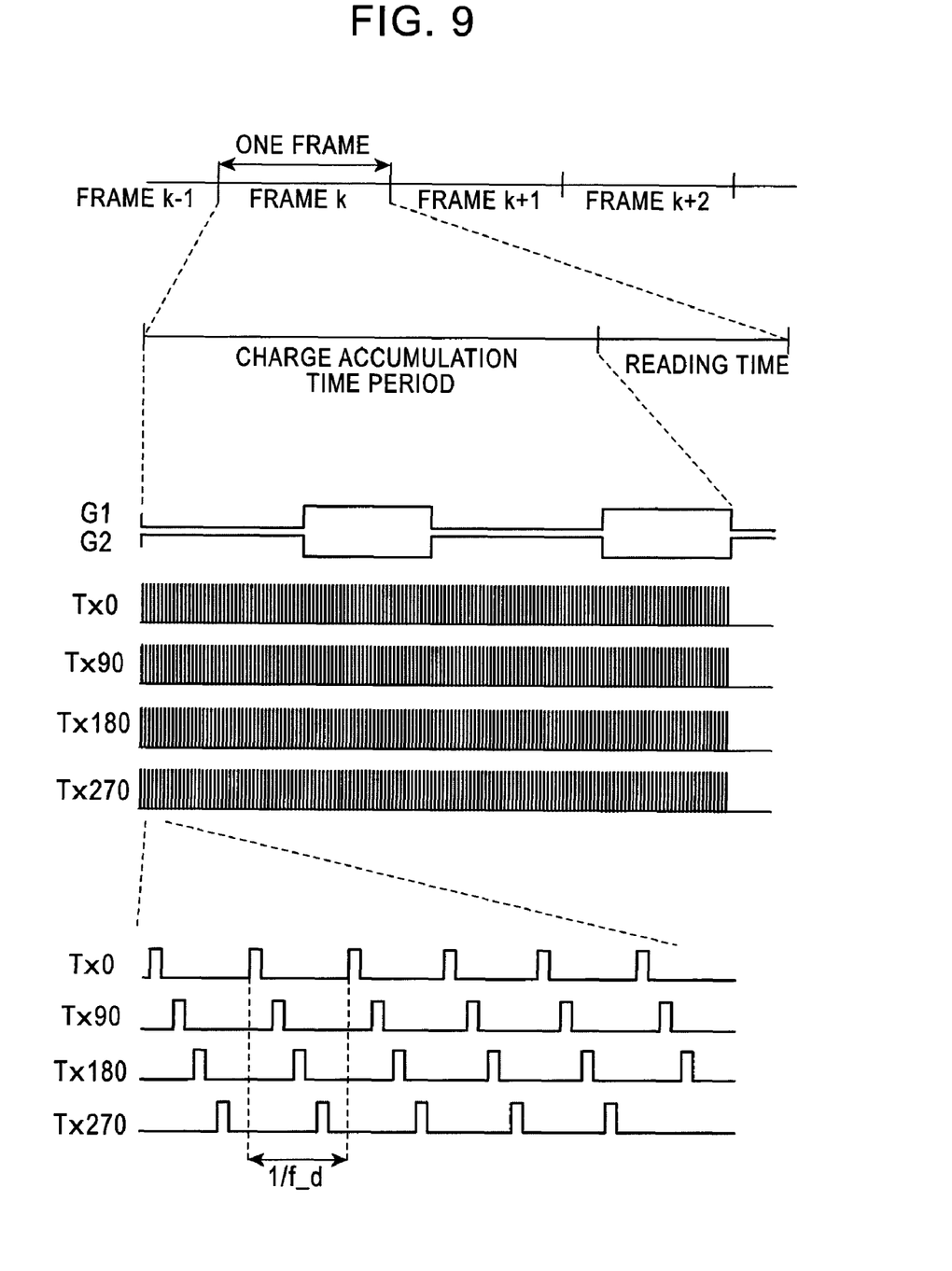
FIG. 9 is a timing chart showing the way to drive the image sensing element in the electromagnetic field high speed imaging apparatus according to the embodiment of the present invention.

The relationship between the number of switching times n and the charge amount shown by the graph of FIG. 8 will be further described using a timing chart of FIG. 9 showing the way that the image sensing element is driven.

As shown in FIG. 9, let one frame refer to the time for acquiring one image. In the time of one frame, there are the charge accumulation time period during which charge is accumulated (the positive connection period and the reverse connection period) and the reading time for reading out the accumulated charge. Here, the charge accumulation time period is 10 ms.

In the embodiment of the image sensing element shown in FIG. 3, there is described the type of image sensing element where one photoelectric conversion element PD is provided with two FET switches M1, M2 (transfer gates Tx1, Tx2) and two charge storages Fd1, Fd2 and where the charge is split using opposite phases of the same duration (Tx1, Tx2 in FIG. 4), but not being limited to this, the present invention can also be applied to the type of image sensing element where one photoelectric conversion element is provided with four FET switches and four charge storages and where the charge is divided between four phases of 90 degrees each; the type of image sensing element which comprises two sets of a separating-accumulating part having one photoelectric conversion element provided with two FET switches and two charge storages, and capacitor connection control parts and divides the charge between four phases of 90 degrees each; and a driving method in which zero degrees-180 degrees and 90 degrees-270 degrees are alternately acquired over two or more consecutive frames to produce one image, none of which is shown. Because the purpose of dividing the charge between four phases of 90 degrees each is the same, the embodiment shown in FIGS. 3 and 4 is an example of the present invention to achieve this purpose.

In the example of FIG. 9, Tx0 indicates a transfer gate signal to transfer the charge of a zero degree phase; Tx90 indicates a transfer gate signal to transfer the charge of a 90 degree phase; likewise, Tx180 a transfer gate signal to transfer for a 180 degree phase; and Tx270 a transfer gate signal to transfer for a 270 degree phase.

The time period during which four phases of Tx0 to Tx270 are opened and closed once each is the inverse of a charge splitting frequency f_d. Here, let the charge splitting frequency f_d be 10 kHz. Then, the time period of splitting between four phases is 100 μs, and the charge splitting is performed 100 times in the charge accumulation time period of 10 ms.

The charge splitting frequency f_d is set equal to the difference frequency component Δf=|fLO−fRF| between the modulation frequency fLO of the modulated light irradiated from the lighting unit 11 and the subject frequency fRF of the electric field or the magnetic field emitted from the subject α.

The toggling of the gate signals G1, G2 is performed an arbitrary number of times (number of switching times) in the charge accumulation time period. In the example of FIG. 9, it is performed three times.

Note that the toggling of the gate signals G1, G2 should not be performed in cycles shorter than 1/f_d that is the time period of dividing the charge between four phases. This is because, if the toggling is performed during the time period of dividing the charge between four phases, the charges for the four phases may not be accurately accumulated, but may be biased toward a certain phase.

Accordingly, in the example of FIG. 9, it is realistic that the number of toggling times (number of switching times) is set to a value of 0 to 99.

Figure 10A:
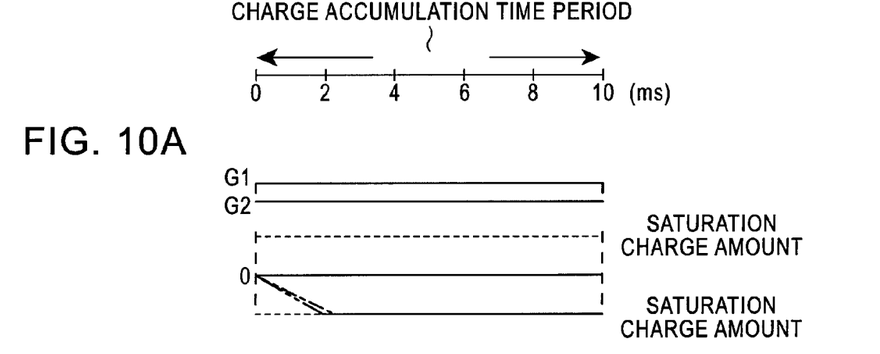
FIGS. 10A to 10D are timing charts showing voltage changes of the first storage capacitor Fd1 and the second storage capacitor Fd2 due to repetitions of the positive connection period and the reverse connection period, for explaining operation results of the solid-state image sensing element in the electromagnetic field high speed imaging apparatus according to the embodiment of the present invention.

FIG. 10A shows the way that the charge is accumulated when the number of toggling times of the gate signals G1, G2 is zero. It is assumed that the charge accumulation time period is 10 ms and that during that period the intensity of the incident light is constant. In the figure, the double dot-dashed line denotes Fd1 (zero degree phase), and the dot-dashed line denotes Fd2 (180 degree phase). Without toggling, the first and second charge storages Fd1, Fd2 become saturated, resulting in no difference component remaining. This state refers to the state of n<n1 in FIG. 8.

Figure 10B:
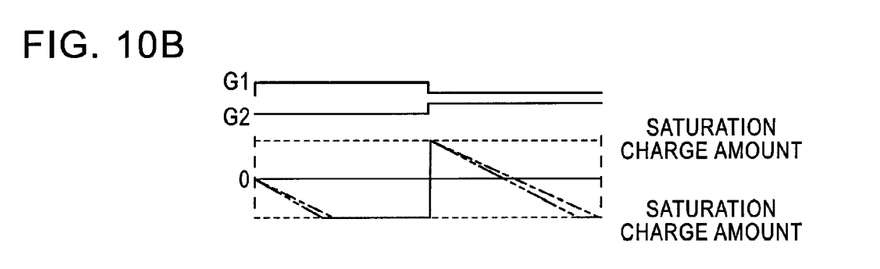

FIG. 10B shows the way that the charge is accumulated when the number of toggling times of the gate signals G1, G2 is one. Also in this case, as in FIG. 10A, the first and second charge storages Fd1, Fd2 become saturated, resulting in no difference component remaining. This state refers to the state of n<n1 in FIG. 8.

Figure 10C:
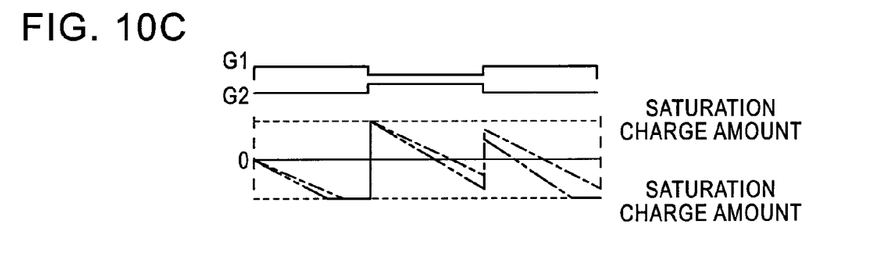

FIG. 10C shows the way that the charge is accumulated when the number of toggling times of the gate signals G1, G2 is three. Although in the end a slight difference component remains, the difference component is reduced because Fd1 becomes saturated around 2 to 3 ms and around 9.5 ms. This indicates that three times of toggling is not enough. This state refers to the state of n1<n<n2 in FIG. 8.

Figure 10D:
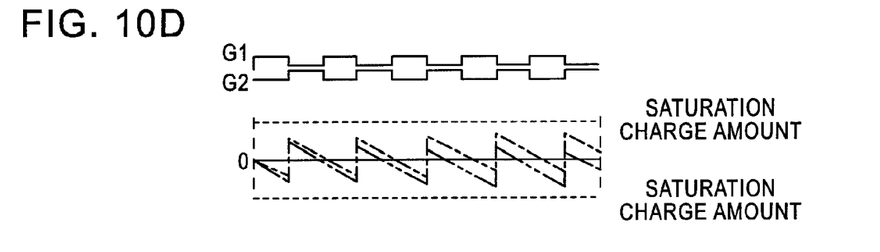

FIG. 10D shows the way that the charge is accumulated when toggling is performed nine times. This is an example case where without saturation occurring, the difference component remains intact. This state refers to the state of n2<n in FIG. 8.

In theory, even if the number of toggling times is greater than nine as in FIG. 10D, the same amount of charge as the amount of the difference component in FIG. 10D will remain. However, in reality, because switching noise occurs due to the gate signals G1, G2 toggling and is superimposed on the charge of the difference component, the difference component decreases with an increase in the number of toggling times. This is what the rightward decline of the graph in the area of n2<n in FIG. 8 means.

Figure 11:
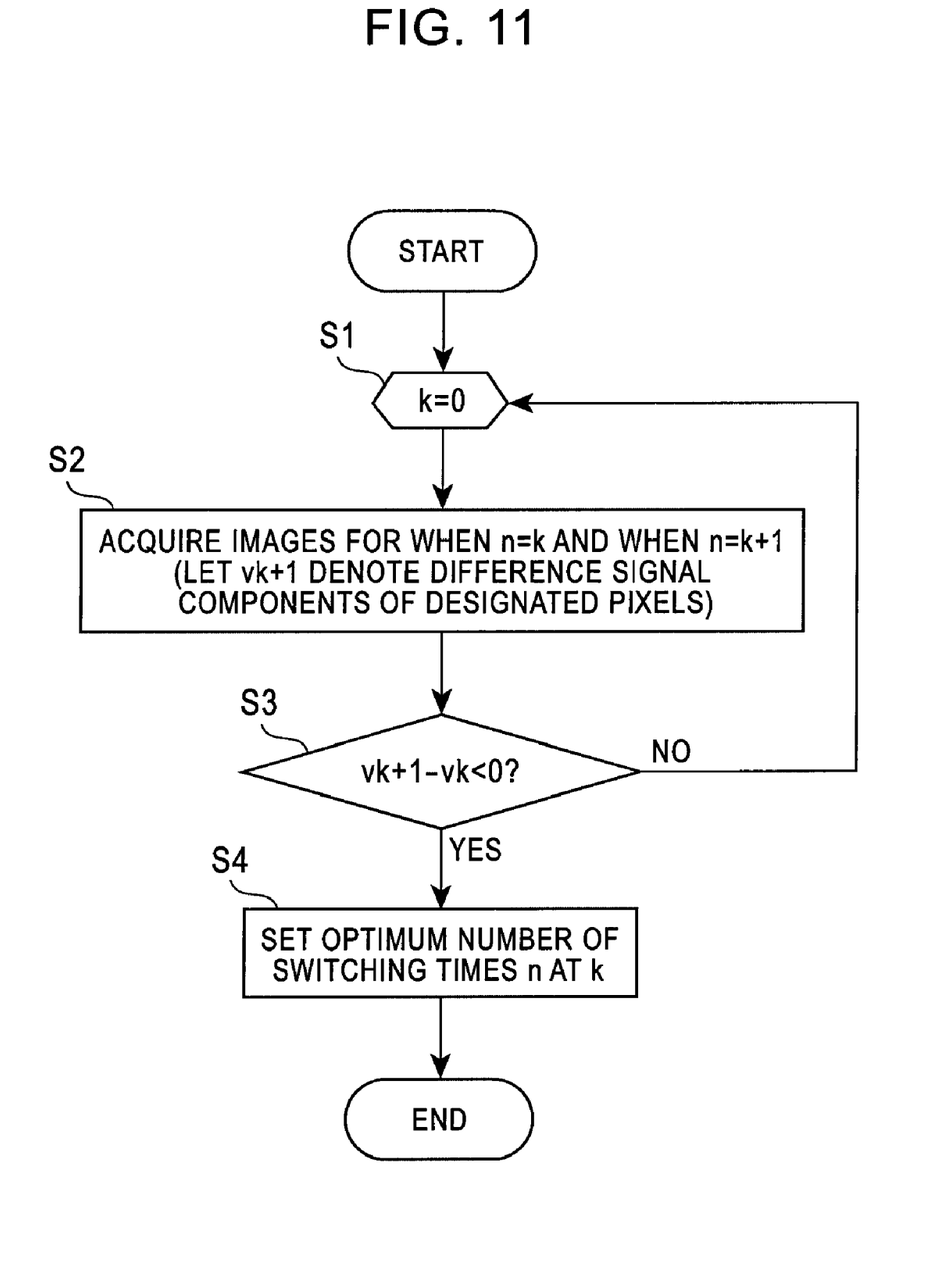
FIG. 11 is a flow chart of determining the optimum number of times of switching between the positive connection period and the reverse connection period.

FIG. 11 shows a flow chart of the operation by the processing unit 15 of determining the optimum number of switching times (number of toggling times) using the characteristic shown in FIG. 8.

First, one or multiple pixels are designated. These pixels are desirably pixels where the electromagnetic field is observed and whose outputs contain the difference signal of the difference frequency component Δf.

In order to acquire an image for when the number of switching times is zero, k is set to 0 (step S1).

An image for when n=k is acquired. Let Vk denote the difference signal component of the designated pixels for this image. Further, an image for when n=k+1 is acquired. Let Vk+1 denote the difference signal component of the designated pixels for this image (step S2).

Then, Vk+1−Vk is computed. If n<n1, Vk+1−Vk=0. If n1<n<n2, Vk+1−Vk is a positive value. If n2<n, Vk+1−Vk is a negative value. Hence, it is determined whether Vk+1−Vk<0 (step S3). If YES, the optimum number of switching times k is determined (step S4). If NO, step S2 is repeated. That is, the value of k at which, gradually increasing the value of k, the value of Vk+1−Vk changes from positive to negative is taken as n2, and the processing unit 15 sends the image sensor 14a a control signal to set n to n2.

Based on the above, the flow chart of FIG. 11 will be described.

The optimum number of toggling times n is searched for with changing the number of toggling times of the gate signals G1, G2 for each frame. At frame 0, an image for n=0 is acquired. Then, a result as shown in FIG. 10A is expected to be obtained. When at frame 1 next thereto an image for n=1 is acquired, a result as shown in FIG. 10B is obtained. Further, when increasing the value of n for each frame, the difference component starts to remain as shown in FIG. 10C. The n1 refers to the value of n at which this happens.

When further increasing the value of n, the remaining difference component increases. That is, let Vn be the remaining difference component when the number of toggling times is n and Vn−1 be the remaining difference component when the number of toggling times is n−1, then Vn>Vn−1.

When yet further increasing the value of n, there is the value of n at which Vn≦Vn−1, that is, the loss of charge due to saturation becomes zero while the loss due to increase in switching noise due to the toggling starts to occur. This value of n is n2. The optimum number of toggling times n is derived in this way.

As a method of deriving n2, there is a method which, starting from a large enough value, i.e., taking FIG. 10 as an example, n=99, gradually decreases the value of n. This method is opposite to the flow chart of FIG. 11. If n>n2, then Vn>Vn−1, and if n≦n2, then Vn≦Vn−1.

As methods of making the difference component remain with preventing saturation, there are firstly a method which shortens the charge accumulation time period and secondly a method which weakens the intensity of light, but since the first and second methods both reduce the charge amount of the difference component, the S/N ratio is expected to be degraded.

As compared with those, in the apparatus according to the present embodiment, by arbitrarily changing the frequency fLO of the light irradiated from the lighting unit 11, the splitting frequency f_d can be changed freely without changing the frequency fRF of the electric field emitted from the subject α. For example, if fLO is 1.001 GHz and fRF is 1.000 GHz, then the charge splitting frequency f_d is 1 MHz. In this case, 1/f_d is 1 μs, and with the type of image sensing element that has two Tx's and two Fd's per photoelectric conversion element PD, theoretically even, light of so strong intensity that they are saturated at 1 μs/2=0.5 μs can be measured. Likewise, with the type of image sensing element that has four Tx's and four Fd's per photoelectric conversion element PD, light of so strong intensity that they are saturated at 1 μs/4=0.25 μs can be measured.

In contrast, with a conventional image sensing element having no charge cancellation function, if light of the same intensity is used, the charge accumulation time period must be about 0.25 to 0.5 μs. Thus, the difference component accumulated in this charge accumulation time period is very small in amount, and hence it is not realistic. Electric field cameras requiring laser light of strong intensity cannot be realized without an image sensing element further having the charge cancellation function like the one of this embodiment from among image sensing elements having the charge splitting function.

The electromagnetic field high speed imaging apparatus of the present invention can be used as an apparatus for measuring the electromagnetic field distribution of an electronic device such as the near electromagnetic field around an integrated circuit device, or the like.

This application is based on Japanese Patent Application No. 2009-190809 which is herein incorporated by reference.

What is claimed is:

1. An electromagnetic field high speed imaging apparatus including:
    a lighting unit capable of outputting modulated light amplitude-modulated with a modulation frequency fLO;
    a probe unit comprising an electrooptic element or magnetooptic element whose birefringence characteristic locally changes due to the electric field or the magnetic field of a subject frequency fRF emitted from a subject that is a measurement subject, thereby causing a local polarization state to occur in the modulated light irradiated thereon from said lighting unit and which has said modulated light further modulated by a near electromagnetic field of the subject frequency fRF for frequency mixing so as to produce detection light containing a difference frequency component Δf between the modulation frequency fLO of said modulated light and the subject frequency fRF;
    an optical unit that converts the local polarization state in the detection light produced by said probe unit into local intensity of light and image-forms the detection light subjected to the local intensity conversion;
    an imaging unit comprising an image sensor having an imaging surface located at a position where said detection light is image-formed by said optical unit and formed of a plurality of pixels, which sensor photoelectric-converts said detection light; and
    a processing unit that analyzes electric signals from the image sensor of said imaging unit and generates information containing a two-dimensional image of distribution of the near electromagnetic field emitted from said subject,
    wherein each of the pixels of the image sensor of said imaging unit comprises a photoelectric conversion element for converting said detection light from said optical unit into an electric charge, a plurality of charge storages, and a charge splitting part for dividing the electric charge generated in the photoelectric conversion element between said plurality of charge storages.

2. An electromagnetic field high speed imaging apparatus according to claim 1, wherein said charge splitting part divides the electric charge generated in the photoelectric conversion element between the plurality of charge storages synchronously with the difference frequency component Δf produced by said probe unit.

3. An electromagnetic field high speed imaging apparatus according to claim 2, wherein the apparatus comprises two said charge storages, and said charge splitting part has first and second switch elements respectively interposed between an end of said photoelectric conversion element and said two charge storages, and control pulse signals opposite in phase to each other, of which a frequency is said difference frequency component Δf and a duty ratio is 50%, are respectively applied to control terminals of said first and second switch elements.

4. An electromagnetic field high speed imaging apparatus according to claim 2, wherein said imaging unit further comprises a plurality of capacitors that each can be conductively connected to said plurality of charge storages, and capacitor connection control parts for controlling conduction states between said plurality of charge storages and said plurality of capacitors.

5. An electromagnetic field high speed imaging apparatus according to claim 4, wherein said processing unit generates a control signal to remove the other charge than a charge component synchronous with the difference frequency component Δf produced by said probe unit based on information from said imaging unit so as to control conduction states between said charge storages and said plurality of capacitors of said imaging unit.

6. An electromagnetic field high speed imaging apparatus according to claim 5, wherein the apparatus comprises two said charge storages and two said capacitors, and said control signal has a positive connection period during which each said charge storage is connected in parallel with a corresponding one of said capacitors in a first polarity and a reverse connection period during which each said charge storage is connected in parallel with the other one of said capacitors in a second polarity opposite to the first polarity, and said positive connection period and said reverse connection period are of an equal time length and alternate.

* * * * *